United States Patent [19]

Miller et al.

[11] Patent Number: 5,023,539
[45] Date of Patent: Jun. 11, 1991

[54] ALTERNATOR VOLTAGE TRANSIENT MINIMIZATION METHOD AND APPARATUS

[75] Inventors: John M. Miller, Saline; James E. Fenton, Ann Arbor; Harold G. Spring, Garden City, all of Mich.

[73] Assignee: Ford Motor Company, Dearborn, Mich.

[21] Appl. No.: 364,910

[22] Filed: Jun. 12, 1989

[51] Int. Cl.$^5$ .................................................. H02J 7/16
[52] U.S. Cl. ......................................... 322/28; 322/59; 322/73
[58] Field of Search ............................ 322/28, 73, 59

[56] References Cited

U.S. PATENT DOCUMENTS

| | | | |
|---|---|---|---|
| 3,710,227 | 1/1973 | Hill | 320/59 |
| 3,723,817 | 3/1973 | Leonard et al. | 317/31 |
| 3,843,921 | 10/1974 | Hill | 322/28 |
| 3,858,103 | 12/1974 | Hill | 320/64 |
| 3,942,096 | 3/1976 | Itoh et al. | 322/28 |
| 3,984,755 | 10/1976 | Lehnhoff et al. | 322/28 |
| 4,096,429 | 6/1978 | Carter | 322/28 |
| 4,455,585 | 6/1984 | Murari et al. | 361/18 |
| 4,679,112 | 7/1987 | Craig | 322/28 X |
| 4,733,159 | 3/1988 | Edwards et al. | 322/28 X |
| 4,831,322 | 5/1989 | Mashino et al. | 322/28 |

*Primary Examiner*—R. J. Hickey
*Attorney, Agent, or Firm*—Paul K. Godwin, Jr.; Roger L. May

[57] ABSTRACT

A method and apparatus for controlling field current in an alternator maintains the alternator output voltage at a defined level and substantially suppresses transients in the event the alternator is disconnected from a load. A pair of MOS Insulated Gate Bipolar Transistors (MOSIGBT's) are connected one in series and one in parallel with the alternator field winding and current is provided to the field winding through the series connected regulator transistor as needed to maintain the alternator output voltage. The field current is auto-commutated through the parallel connected transient suppression transistor when the regulator transistor is off. When the alternator is disconnected from a load, both transistors are switched off in a controlled manner to discharge the field winding energy at a high voltage and at an accelerated rate within the parallel connected transistor. The series connected transistor is nearly intantaneously turned off to remove the source of field current and the parallel connected transistor is "ramped" off or turned off at a controlled rate to act as a controlled resistance and thereby dissipate the field energy at a high voltage level. By dissipating the field energy at a high voltage level, the dissipation time is substantially reduced as compared to prior art arrangements. The present invention is generally applicable to alternator circuits and is particularly applicable to automotive battery charging systems.

12 Claims, 3 Drawing Sheets

TRANSIENT ENERGY IS 141.3 JOULES

TRANSIENT ENERGY IS 5.7 JOULES

ALTERNATOR VOLTAGE TRANSIENT MINIMIZATION METHOD AND APPARATUS

BACKGROUND OF THE INVENTION

The present invention relates generally to electronic voltage regulation of field current in an alternator which, for example, can form part of a battery charging system for an automotive vehicle. More particularly, the invention is directed to a method and apparatus for using a pair of high voltage MOS Insulated Gate Bipolar Transistors (MOSIGBT's) to control the current in a field winding of such an alternator to both maintain a desired regulated output voltage and to protect the alternator and circuitry connected to the alternator from high voltage electrical transients generated if the alternator is disconnected from a load either intentionally or due to a fault condition. The present invention is particularly applicable to automotive battery charging systems and, accordingly will be described with reference to such a system.

In automotive battery charging systems, voltage regulation is commonly performed by monitoring an alternator output voltage/battery voltage and controlling the current through a field winding of the alternator to power automotive loads and to charge the battery. If a fault occurs within a charging system, such as the disconnection of the alternator from the battery, large transient voltages are generated at the alternator. The large transient voltages are due to the energy of self-inductance of the field winding and can damage the alternator, the regulator and/or other automotive loads if connected to the alternator output at the time the fault occurs.

In the prior art, attempts have been made to avoid damage by connecting voltage limiting and/or energy dissipating elements to the alternator output, the field winding of the alternator or the associated automotive loads. One example of a prior art attempt at transient control is illustrated in Murari et al, U.S. Pat. No. 4,455,585 wherein integrated circuits manufactured according to the usual processes for low voltage integrated circuit structures are employed. In Murari et al, a zener diode is connected either directly or switchably in series with a return diode to control a fault transient such that low voltage structures can be used. Alternately, the series connected zener diode and return diode are replaced by a low voltage PNP transistor which is connected across the field winding. A conventional regulator is connected to the PNP transistor base terminal to keep the transistor in the conducting state to return field current when a field current control transistor is inoperative and to produce a predetermined voltage between the collector and the emitter during a fault condition.

Unfortunately, Murari et al's low voltage PNP transistor cannot suppress the field decay transient to an effective level and may shunt the field winding during normal operation and hence contribute to loss of alternator regulation. Field winding shunting occurs due to operation of the low voltage PNP transistor in its inverse active region as the result of large reverse voltages which are repeatedly applied across the collector/emitter terminals of the PNP transistor as the regulation transistor is switched on and off.

Accordingly, there is a need for a method and apparatus for controlling the current in a field winding of an alternator to maintain a desired regulated alternator output voltage and to protect the alternator and equipment connected to an output of the alternator in the event the alternator is disconnected from a load it is driving, for example by a fault within a charging system utilizing the alternator, which otherwise causes potentially damaging high voltage transients at the alternator output.

SUMMARY OF THE INVENTION

This need is met by the method and apparatus of the present invention for controlling field current in an alternator wherein a pair of MOS Insulated Gate Bipolar Transistors (MOSIGBT's) are connected one in series and one in parallel with a field winding of the alternator. In this configuration, current is provided as needed to the alternator field winding through the series connected transistor to maintain the alternator output at a desired voltage level and the field current is returned through the parallel connected transistor when the series connected transistor is turned off. When the alternator output is disconnected from a load, for example due to a fault in a battery charging system including the alternator, both transistors are switched off in a controlled manner to discharge the field winding energy at an accelerated rate within the parallel connected transistor. The series connected transistor is nearly instantaneously turned off to remove the source of field current and the parallel connected transistor is then "ramped" off or turned off at a controlled rate to act as a controlled resistance and thereby dissipate the field energy at a high voltage level. By dissipating the field energy at a high voltage level within the parallel connected transistor, the dissipation time is substantially reduced as compared to prior art arrangements.

In accordance with one aspect of the present invention, circuitry for controlling the flow of current from a power supply through a field winding of an alternator comprises a first insulated gate transistor connected in series with and between a power supply and the field winding for selectively providing current from the power supply to the field winding. A second insulated gate transistor is connected across the field winding. Regulator means is connected to an output of the alternator and the first and second transistors for controlling the operation of the transistors to auto-commutate the current through the field winding for maintenance of a desired regulated output voltage at the alternator output. The regulator means further provides for switching off the first and second transistors in a controlled manner in the event of a disconnection of the alternator output from a load driven by the alternator such that energy stored in the field winding is rapidly dissipated at a high voltage in the second transistor to substantially suppress a voltage transient generated at the alternator output by the disconnection.

Preferably, the regulator means ramps off the control voltage of the second transistor upon disconnection of the alternator from the load. The first and second insulated gate transistors are both PNP transistors or both NPN transistors, as preferred for a given application. The alternator may be a part of a charging system used to charge a battery of a motor vehicle with the power supply comprising a battery. For such a battery charging application, the alternator disconnection would typically be a fault within the charging system. Ramp timing is preferably defined by connecting a selected valve resistor into the gate circuit of the second transistor with the ramp time being defined by the selected resistance of the resistor and the capacitance of the gate of the second transistor.

In accordance with another aspect of the present invention, a method for controlling the flow of current from a power supply and through a field winding of an alternator comprises the steps of: connecting a first insulated gate transistor in series with and between the power supply and the field winding; connecting a second insulated gate transistor in parallel with the field winding; controlling the operation of the first and second transistors to auto-commutate the current through the field winding to maintain a desired regulated voltage at an output of the alternator; and, switching off the first and second transistors in a controlled manner in the event of disconnection of the alternator output from a load such that energy stored in the field winding is rapidly dissipated at a high voltage in the second transistor to substantially suppress a voltage transient generated at the alternator output by the disconnection.

Preferably, the step of switching off the first and second transistors in a controlled manner comprises ramping off the control voltage of the second transistor for switch off upon disconnection of the alternator output from the load. The first and second insulated gate transistors are both PNP transistors or both NPN transistors, as preferred for a given application. The alternator may be a part of a charging system used to charge a battery of a motor vehicle with the power supply comprising a battery. For such a battery charging application, the alternator disconnection would typically be a fault within the charging system. Ramping off of the second transistor is preferably formed by connecting a resistor into the gate circuit of the second transistor which resistor in combination with gate capacitance defines the ramp off time.

It is thus an object of the present invention to provide an improved method and apparatus for controlling the current in a field winding of an alternator, used for example in a battery charging system, to both maintain a desired regulated alternator output voltage and to protect the alternator and circuitry connected to the alternator in the event of disconnection of the alternator from a load; to provide an improved method and apparatus for controlling the current in a field winding of an alternator by using a pair of high voltage MOS Insulated Gate Bipolar Transistors (MOSIGBT's); and, to provide an improved method and apparatus for controlling the current in a field winding of an alternator by connecting a first MOSIGBT in series with a field winding of the alternator and a second MOSIGBT in parallel with the field winding, both transistors being switched off in a controlled manner to discharge the field winding energy at an accelerated rate in the parallel connected transistor if the alternator is disconnected from a load.

Other objects and advantages of the invention will be apparent from the following description, the accompanying drawings and the appended claims.

DETAILED DESCRIPTION OF THE INVENTION

Figure 1:
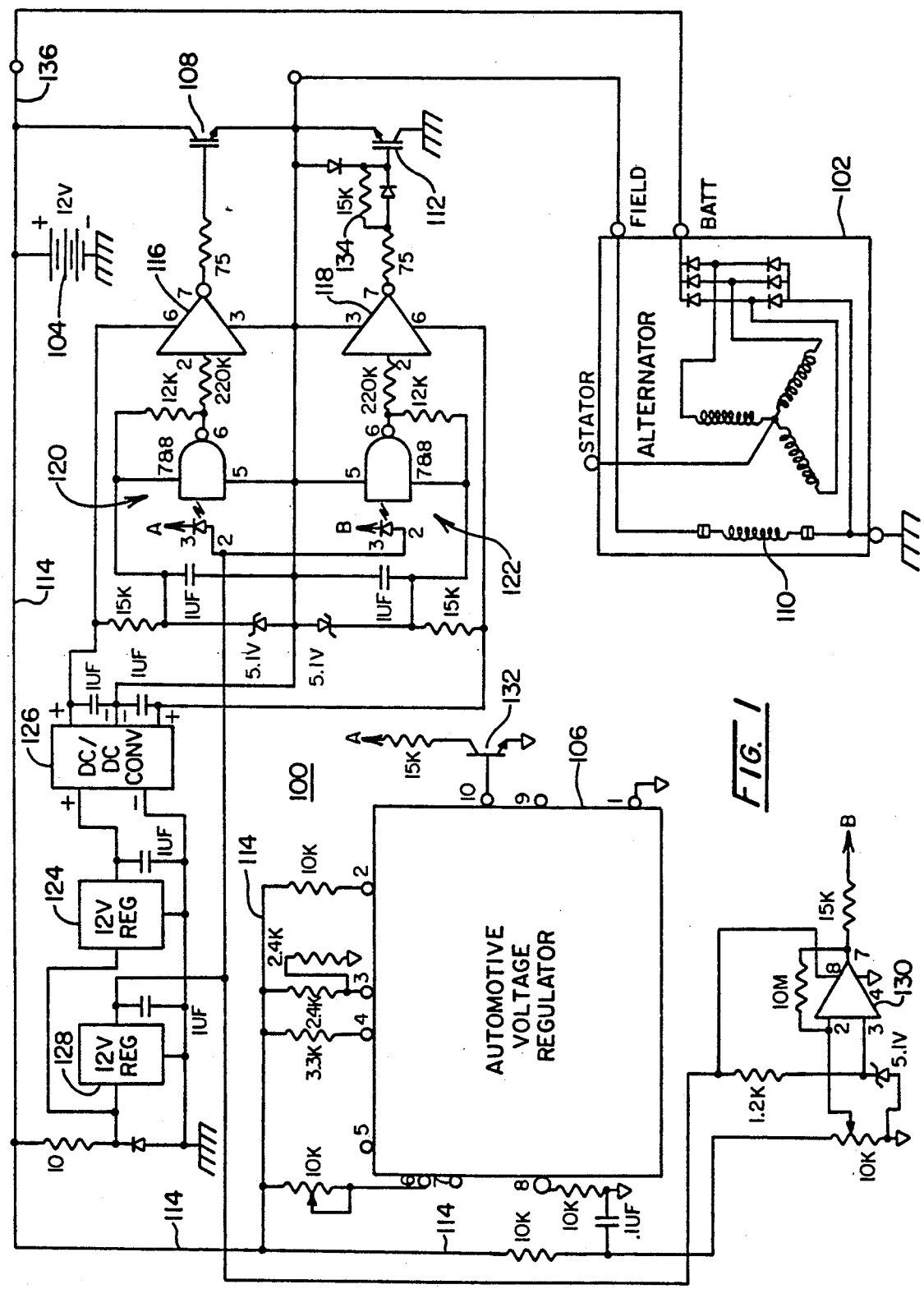
FIG. 1 is an electrical schematic diagram of an automotive battery charging system incorporating the present invention.

Reference is now made to the electrical schematic diagram of FIG. 1 which illustrates a charging system 100. An automotive alternator 102 is controlled to provide a desired power output at a voltage level to maintain the charge of an associated automotive battery 104. The voltage of the battery 104/alternator output (BATT) is monitored and its charging regulated by means of an automotive voltage regulator 106 which can be an integrated circuit commercially available, for example, from Motorola Semiconductors and identified as an MC3325. A first high voltage insulated gate transistor 108 preferably comprising a MOS insulated gate bipolar transistor sold by IXYS and identified by the designation IXGP10N90 is connected in series with and between the battery 104 and a field winding 110 of the alternator 102. The transistor 108 is controlled to selectively provide current from the battery 104 to the field winding 110. A second high voltage insulated gate transistor 112 preferably comprising a MOS insulated gate bipolar transistor of the same type as the transistor 108 is connected in parallel with the field winding 110.

The transistor 108 is switched on and off under the control of the voltage regulator 106 to pulse width modulate the field current in response to the voltage of the battery 104/alternator output (BATT) and the ambient temperature. Battery voltage is monitored via a battery sense conductor 114 connected between the battery 104 and the voltage regulator 106. A gate voltage is continuously applied to the transistor 112 under normal operating conditions such that it circulates the current through the field winding 110 when the transistor 108 is turned off. However, while the transistor 108 is turned on, the collector/emitter or drain/source of the transistor 112 is reverse biased such that the transistor 112 is reverse blocking and does not shunt the field winding 110 or affect alternator regulation. In this way, when the transistor 108 is switched off, the current through the field winding 110 auto-commutates into the transistor 112 to maintain a desired regulated battery voltage or state of charge of the battery 104.

The transistors 108, 112 are driven by a pair of MOSFET drivers 116, 118, respectively, which are commercially available, for example, from Teledyne semiconductor and identified by the designation TSC428. The drivers 116, 118 are in turn driven by optocouplers 120, 122, respectively, commercially available from Hewlett Packard and identified by the designation 6N137. Power for driving the transistors 108, 112 is provided by a 12V regulator 124 which can be a commercially available LM340T12 and a DC/DC converter 126 which can be a commercially available UR12-15D40. The converter 126 provides isolated ±15 volt outputs in response to a regulated 12 volt input. A second 12V regulator 128 provides additional power for the optocouplers 120, 122 and a comparator circuit 130 which is used to turn off the transistor 112 in a controlled manner in case of faults as will become apparent. The optocouplers 120, 122 and DC/DC converter 126 provide isolation between the voltage regulator 106, the comparator 130 and the high voltages generated on the transistors 108, 112 during normal and fault operation.

Figure 3:
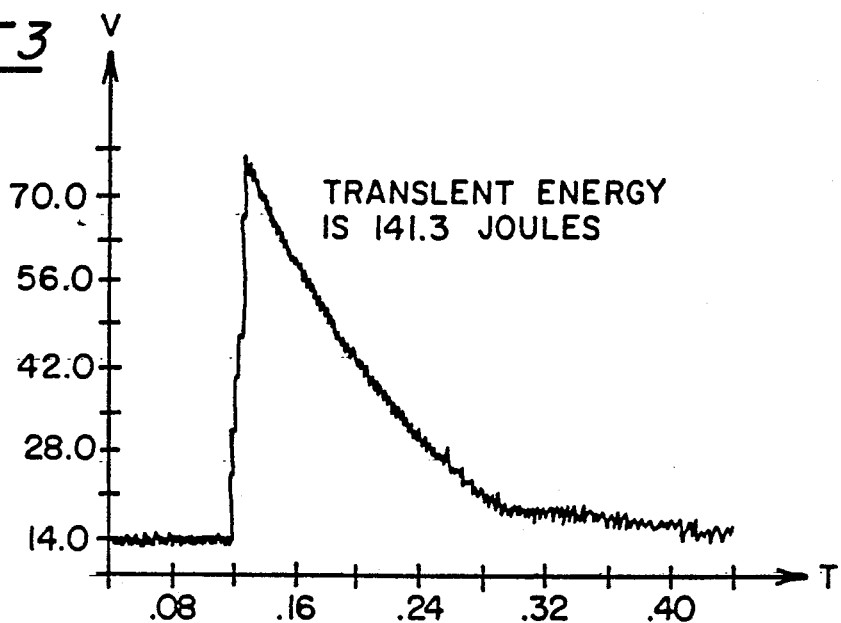
FIGS. 3 and 4 are waveforms of the high voltage transients generated utilizing prior art protection techniques and the present invention, respectively.
Figure 4:
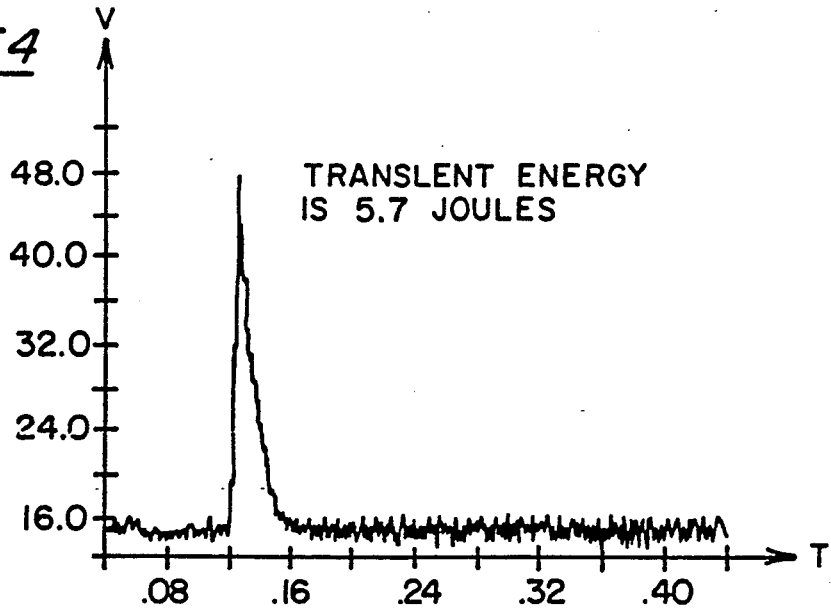

If a fault occurs within a charging system utilizing the alternator, such as the disconnection of the battery 104 from the remainder of the system 100 or the failure of an intercell connection within the battery 104, a high voltage transient is generated at the alternator output (BATT) due to the sudden change in the alternator output current when the battery current component goes to zero. Such transients are due to the sudden current change in the inductive stator 131, the self-inductance of the field winding 110, the continuing field winding current which couples the engine to the alternator and residual iron magnetism. In the prior art, voltage limiting and/or energy dissipating elements have been connected to the alternator output (BATT), the field winding 110 and/or the alternator 102 and associated automotive equipment. For example, the voltage transient generated on an automotive 12V bus by a current production voltage regulator including conventional suppression techniques is shown in FIG. 3 for a fault occurring at 8000 RPM and an 80 amp load on the alternator 102. While this level of protection permits operation of an automobile utilizing the charging system, it is substantially greater than the transient generated under the same operating and fault conditions by the method and apparatus of the present invention as shown in FIG. 4. With such reduced transients, overall system operation and reliabilty are substantially improved.

If a fault occurs within the illustrated charging system 100, the onset of an overvoltage transient is sensed by the voltage regulator 106 and the comparator 130. In response to sensing the onset of what may well have been a damaging overvoltage transient in the prior art, the transistors 108 and 112 are turned off in a controlled manner. In particular, the voltage regulator 106 nearly instantaneously (within approximately 1.5 microseconds) turns off the regulation transistor 108 and the comparator 130 generates a turn off signal for the transistor 112. The transistor 108 is turned off via the transistor 132, the optocoupler 120 (note A—A interconnection) and the driver 116. The transistor 112 is turned off via the comparator 130, the optocoupler 122 (note B—B interconnection) and the driver 118.

However, in the case of the transistor 112, a resistor 134 is inserted into the base or gate circuit such that the transistor 112 is "ramped" off or turned off at a controlled rate. The resistor 134 in combination with the gate capacitance of the transistor 112 forms an RC circuit to ramp off the transistor 112 for fault conditions. In the illustrated embodiment of FIG. 1, the resistor 134 is selected to be 15K ohms which, in combination with the capacitance of the gate of the previously identified MOSIGBT used for transistor 112, provides a ramp time on the order of tenths of milliseconds and has been determined to substantially minimize the transient energy produced on the +12V bus 136 of the motor vehicle including the charging system 100. For example, the energy of the transient of FIG. 3 is 141.3 joules while the energy of the transient of FIG. 4 is reduced to 5.7 joules. Of course, different resistance values can be selected for the resistor 134 dependent upon the transistor 112 utilized and the desired ramp characteristics of transistor turn off in the event of a fault condition and the turn off of the transistor 112 can be controlled in alternate ways, such as controlled steps or the like, as will be apparent to those skilled in the art.

Figure 2:
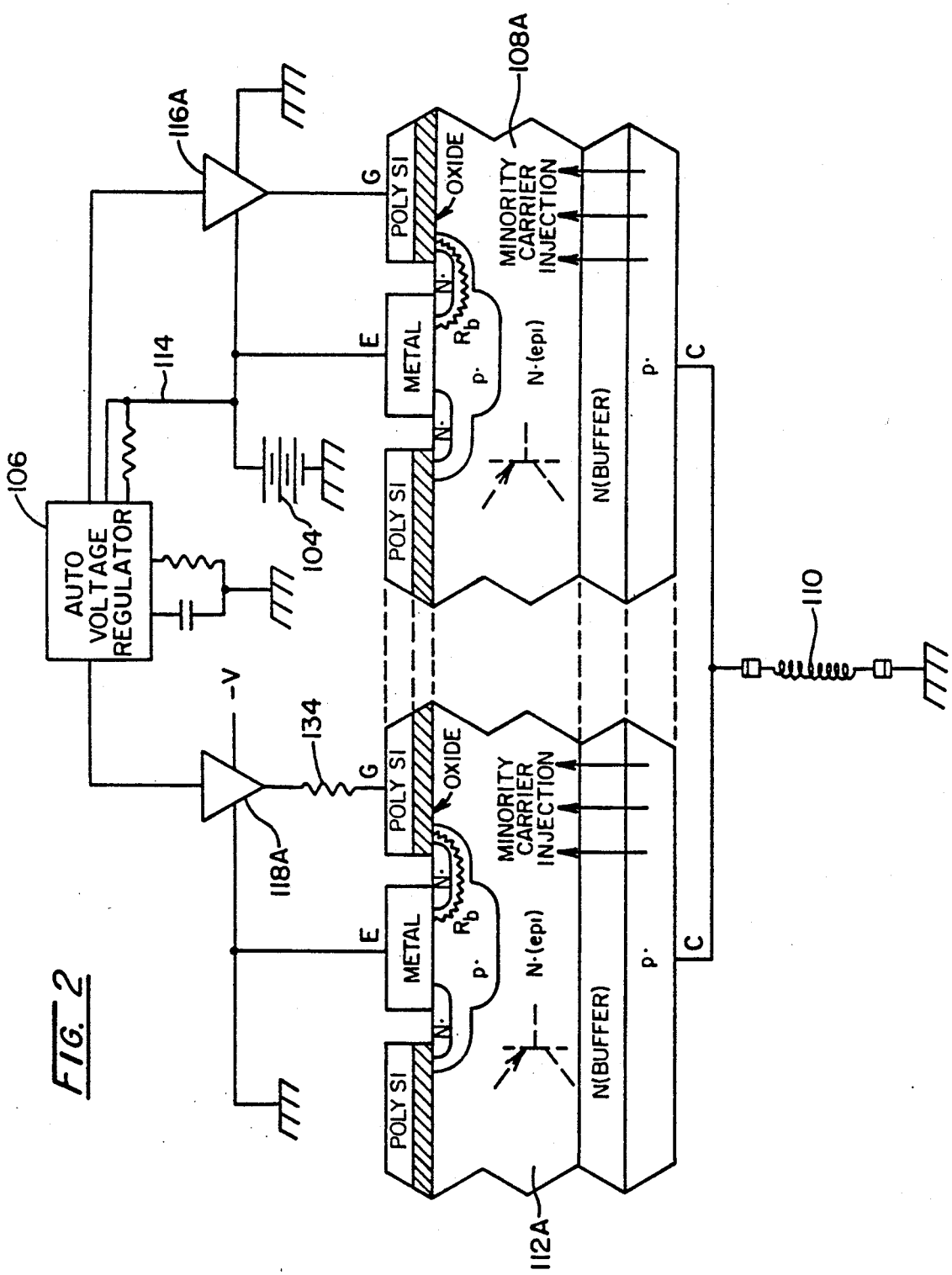
FIG. 2 is a schematic block diagram of an alternate embodiment of the present invention.

An alternate embodiment of the invention utilizing PNP transistors 108A, 112A is shown in FIG. 2 in schematic block diagram form with like components being assigned the same identifying numerals. A physical structure of the PNP transistors 108A, 112A is illustrated in this embodiment which may be desireable for formation of the transistors 108A, 112A in the form of an integrated circuit. As shown, the common collectors C or drains (substrate) form the connection point for the field winding 110 with top metalizations forming the two emitters E or sources. Hybrid circuit, thick film techniques are envisioned as being best to form a combined regulator/gate drive circuitry with the two P-channel devices existing as a single device.

The illustrated embodiments of the present invention control the current in the field winding 110 of the automotive alternator 102 of the battery charging system 100 to maintain the battery voltage within defined limits and to substantially suppress transients in the event of faults in the charging system, such as disconnection of the alternator 102 from the battery 104 or failure of intercell connections within the battery 104. When such a fault occurs within the system 100, both transistors 108, 112 or 108A, 112A are switched off in a controlled manner to discharge the field winding energy at an accelerated rate. The series connected transistor 108, 108A is nearly instantaneously turned off to remove the source of field current and the parallel connected transistor 112, 112A is then ramped off to act as a controlled resistance and thereby dissipate the field energy at a high voltage level within the parallel connected transistor 112, 112A. By dissipating the field energy at a high voltage level, the dissipation time is substantially reduced as compared to prior art arrangements.

It should be apparent that the present invention is generally applicable to alternators used for applications other than battery charging systems. For example, a high voltage alternator may be used in the automotive industry to power vehicle loads requiring high power levels such as electrical air conditioning, four wheel steering and the like. For such applications, the alternator is disconnected from the load by power switching operations. Such disconnections are effectively the same as faults within a battery charging system in that they generate high voltage transients at the output of the alternator. Accordingly, the present invention is equally applicable to such systems as well as dual voltage level alternators and other alternator applications where transients are generated either by load disconnections or due to faults within the system. These alternate applications may be accommodated by minor modifications of the disclosed charging system as will be apparent to those skilled in the art and therefore are not described in detail herein.

Having thus described the alternator voltage transient minimization method and apparatus of the present invention in detail and by reference to preferred embodiments thereof, it will be apparent that modifications and variations are possible without departing from the scope of the invention defined in the appended claims.

What is claimed is:

1. Circuitry for controlling the flow of current from a power supply through a field winding of an alternator comprising:
    a first insulated gate transistor connected in series with and between said power supply and said field winding for selectively providing current from said power supply to said field winding;
    a second insulated gate transistor connected across said field winding; and regulator means connected to an output of said alternator for controlling the operation of said first and second transistors to auto-commutate the current through said field winding to maintain a desired regulated output voltage at said alternator output, said regulator means further providing for switching off said first and second transistors in a controlled manner in the event of a disconnection of said alternator output from a load driven by said alternator such that energy stored in said field winding is dissipated in said second transistor to substantially suppress a voltage transient generated at said alternator output by said disconnection.

2. Circuitry for controlling the flow of current through a field winding of an alternator as claimed in claim 1 wherein said regulator means ramps off the control voltage of said second transistor for switch off upon disconnection of said alternator output from said load.

3. Circuitry for controlling the flow of current through a field winding of an alternator as claimed in claim 2 wherein said first and second insulated gate transistors are PNP transistors.

4. Circuitry for controlling the flow of current through a field winding of an alternator as claimed in claim 2 wherein said first and second insulated gate transistors are NPN transistors.

5. Circuitry for controlling the flow of current through a field winding of an alternator as claimed in claim 2 wherein said alternator is part of a charging system used to charge a battery of a motor vehicle and said power supply comprises said battery.

6. Circuitry for controlling the flow of current through a field winding of an alternator as claimed in claim 2 wherein said second transistor includes a gate control input which presents a defined capacitance and said regulator mean comprises a resistor connected to said gate to define the ramp for switch off of said second transistor, the resistance of said resistor being selected such that when combined with said capacitance a desired ramp off time is defined.

7. A method for controlling the flow of current from a power supply through a field winding of an alternator comprising the steps of:

connecting a first insulated gate transistor in series with and between said power supply and said field winding;

connecting a second insulated gate transistor in parallel with said field winding;

controlling the operation of said first and second transistors to auto-commutate the current through said field winding to maintain a desired voltage at an output of said alternator; and switching off said first and second transistors in a controlled manner in the event of disconnection of said alternator output from a load driven by said alternator such that energy stored in said field winding is dissipated in said second transistor to substantially suppress a voltage transient generated at said alternator output by said disconnection.

8. A method for controlling the flow of current through a field winding of an alternator as claimed in claim 7 wherein the step of switching off said first and second transistors in a controlled manner comprises ramping off the control voltage of said second transistor for switch off upon disconnection of said alternator output from said load.

9. A method for controlling the flow of current through a field winding of an alternator as claimed in claim 8 wherein said first and second insulated gate transistors are PNP transistors.

10. A method for controlling the flow of current through a field winding of an alternator as claimed in claim 8 wherein said first and second insulated gate transistors are NPN transistors.

11. A method for controlling the flow of current through a field winding of an alternator as claimed in claim 8 wherein said alternator is part of a charging system used to charge a battery of a motor vehicle and said power supply comprises said battery.

12. A method for controlling the flow of current through a field winding of an alternator as claimed in claim 8 wherein the step of ramping off the control voltage of said second transistor comprises the step of connecting a selected resistance to a control gate of said second transistor, said resistance in combination with gate capacitance of said second transistor defining a ramp time for switch off of said second transistor upon disconnection of said alternator output from said load.

* * * * *